United States Patent
Gilad

(10) Patent No.: US 12,141,514 B1
(45) Date of Patent: Nov. 12, 2024

(54) METHOD AND SYSTEM FOR TRACING AND IDENTIFYING TARGET SIGNALS BY CROSS-CORRELATION TO A SIGNAL PATTERN FOR A CIRCUIT

(71) Applicant: Cadence Design Systems, Inc., San Jose, CA (US)

(72) Inventor: Yuval Gilad, Cedar Park, TX (US)

(73) Assignee: Cadence Design Systems, Inc., San Jose, CA (US)

( * ) Notice: Subject to any disclaimer, the term of this patent is extended or adjusted under 35 U.S.C. 154(b) by 513 days.

(21) Appl. No.: 17/545,813

(22) Filed: Dec. 8, 2021

(51) Int. Cl.
  *G06F 30/367* (2020.01)
  *G06F 3/14* (2006.01)
(52) U.S. Cl.
  CPC .............. *G06F 30/367* (2020.01); *G06F 3/14* (2013.01)
(58) Field of Classification Search
  CPC ................................ G06F 30/367; G06F 3/14
  See application file for complete search history.

(56) References Cited

U.S. PATENT DOCUMENTS

| | | | |
|---|---|---|---|
| 2008/0130788 A1* | 6/2008 | Copeland | H03F 1/3258 375/297 |
| 2017/0091360 A1* | 3/2017 | Adaikalasamy | G06F 30/331 |

* cited by examiner

*Primary Examiner* — Nghia M Doan
(74) *Attorney, Agent, or Firm* — Foley & Lardner LLP

(57) ABSTRACT

Implementations can include a system to trace and identify target signals by cross-correlation to a signal pattern for a circuit, the system including a data processing system including memory and one or more processors to identify a target signal among a plurality of signals propagating through a circuit, detect one or more reference signals associated with an input to the target signal, the reference signals satisfying a threshold based on a depth associated with the target signal and the circuit, generate a cross-correlation object between the target signal and the reference signals based on a waveform of the target signal and corresponding waveforms of the reference signals, generate a metric corresponding to a cross-correlation between at least a portion of the target signal and at least a portion of the cross-correlation object, and modify, based on the metric, a control object of the circuit, the control object associated with the target signal.

20 Claims, 11 Drawing Sheets

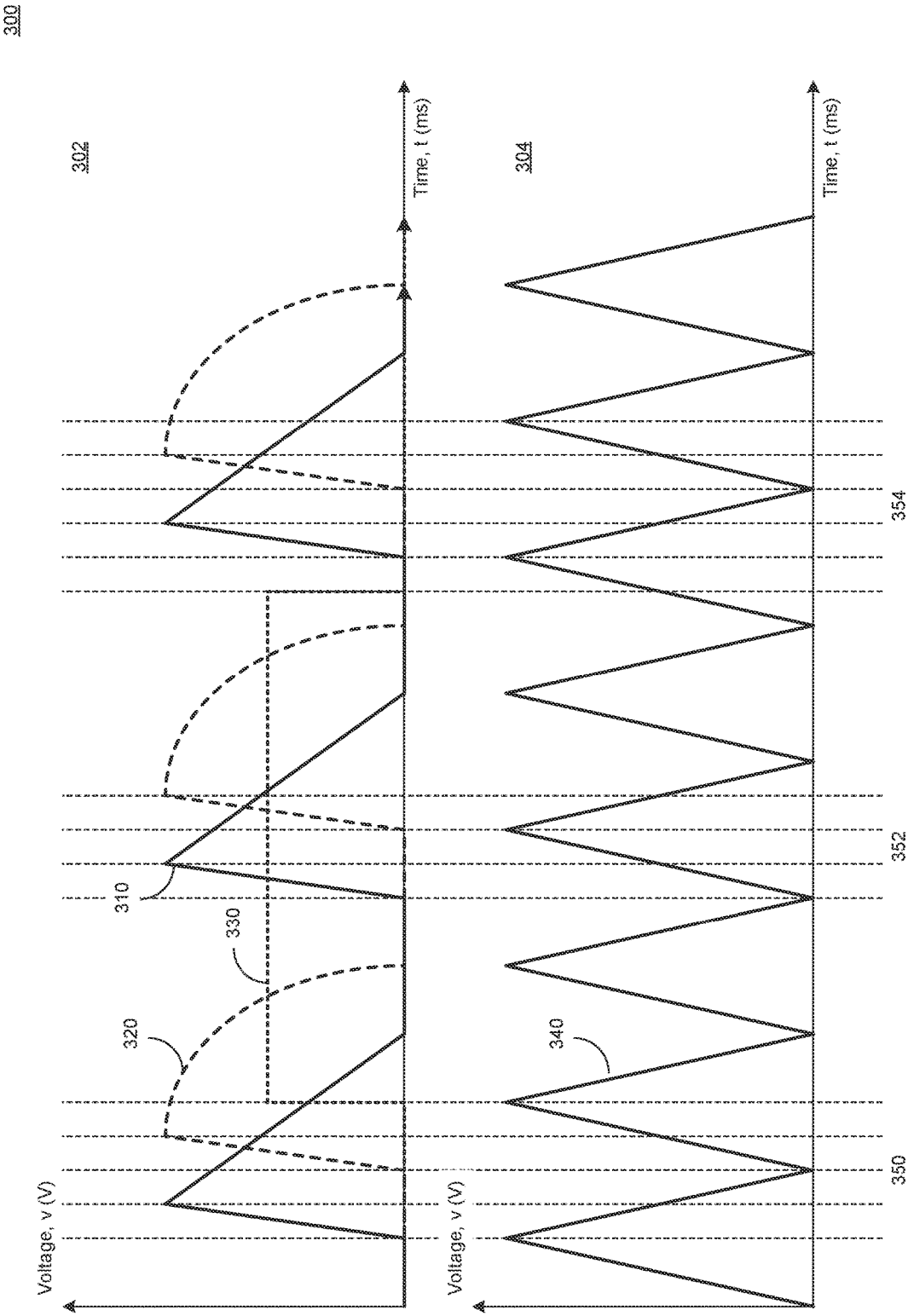

METHOD AND SYSTEM FOR TRACING AND IDENTIFYING TARGET SIGNALS BY CROSS-CORRELATION TO A SIGNAL PATTERN FOR A CIRCUIT

TECHNICAL FIELD

The present implementations relate generally to electronic circuits, and more particularly to tracing and identifying target signals by cross-correlation to a signal pattern for a circuit.

BACKGROUND

Computing hardware is increasingly complex, and contributes to increasing demand for testing and simulation of computing hardware. As computing hardware increases in complexity, cost and time required to develop and test prototype hardware increases rapidly, causing significant delay and wasted resources. Conventional systems cannot effectively and efficiently test and validate computing hardware with sufficient speed and granularity to ensure correct and predictable operation of complex computing hardware.

SUMMARY

Embodiments described herein are directed to tracing and identifying target signals by cross-correlation to a signal pattern for a circuit. Computing hardware devices can operate in response to many hundreds, thousands, and millions of concurrent and interdependent signals transmitted by and through various physical devices of the computing hardware devices. An emulation system in accordance with present implementations can advantageously determine anomalies in transmission or generation of a particular signal, for example, based on the similarity of that signal to other concurrent signals in the hardware system. The emulation system can further advantageously reduce the amount of computational resources required to detect anomalous signals in the emulated hardware device by isolating signals influencing a particular target signal, and detecting similarity between the target signals and multiple signals providing direct or indirect input to the target signal. The emulation system can thus advantageously detect anomalous patterns in the operation of an emulated hardware device based on detecting many hundreds, thousands, and millions of detected signals or more, with respect to a target signal.

Embodiments described herein may provide several advantages, including at least the advantages discussed herein. First, an emulation system may reduce computational resources required to identify an anomalous trace signal by generating a cross-correlation object based on expected activity and an absolute or relative amount of deviation from the expected activity. Second, an emulation system may provide one or more indications via a user interface regarding anomalous signal propagation with respect to machine code associated with the anomalous signal propagation. The emulation system can provide indications advantageously identifying particular portions of machine code associated with the anomalous signal propagation. Thus, a technological solution for tracing and identifying target signals by cross-correlation to a signal pattern for a circuit is provided.

In one embodiment, a system to trace and identify target signals by cross-correlation to a signal pattern for a circuit can include including a data processing system including memory having machine-executable instructions stored thereon that when executed by one or more processors cause the one or more processors to identify a target signal among a plurality of signals propagating through a circuit, detect one or more reference signals associated with an input to the target signal, the reference signals satisfying a threshold based on a depth associated with the target signal and the circuit, generate a cross-correlation object between the target signal and the reference signals based on a waveform of the target signal and corresponding waveforms of the reference signals, generate a metric corresponding to a cross-correlation between at least a portion of the target signal and at least a portion of the cross-correlation object, and modify, based on the metric, a control object of the circuit, the control object being associated with the target signal and presentable on a graphical user interface.

The system may include a cross-correlation object based on at least one transition of at least one of the target signal and at least one transition of at least one of the reference signals at a cross-correlation timepoint.

The system may include the cross-correlation object based on at least one value of at least one of the target signal and at least one value of at least one of the reference signals at a cross-correlation timepoint.

The system may generate the cross-correlation object by combining the waveform of the target signal and the corresponding waveforms of the reference signals.

The system may include the depth corresponding to a number of devices of the circuit through which the target signal propagates.

The system may modify a presentation of the control object at a user interface, where the control object includes machine code corresponding to the target signal.

The system may include the presentation of the control object including a presentation of the machine code having a presentation format based on the metric.

The system may include the target signal and the reference signals associated with a plurality of portions of the circuit having a structure to generate the target signal.

The system may include the reference signals including a subset of signals associated with each of the portions of the circuit having the structure to generate the target signal.

In another embodiment, a method of tracing and identifying target signals by cross-correlation to a signal pattern for a circuit, may include identifying a target signal among a plurality of signals propagating through a circuit, detecting one or more reference signals associated with an input to the target signal, the reference signals satisfying a threshold based on a depth associated with the target signal and the circuit, generating a cross-correlation object between the target signal and the reference signals based on a waveform of the target signal and corresponding waveforms of the reference signals, and being shifted with respect to the target signal, generating a metric corresponding to a cross-correlation between at least a portion of the target signal and at least a portion of the cross-correlation object, and modifying, based on the metric, a control object of the circuit, the control object being associated with the target signal.

The method may include the cross-correlation object based on at least one transition of at least one of the target signal and at least one transition of at least one of the reference signals at a cross-correlation timepoint.

The method may include the cross-correlation object based on at least one value of at least one of the target signal and at least one value of at least one of the reference signals at a cross-correlation timepoint.

The method may include generating the cross-correlation object by combining the waveform of the target signal and the corresponding waveforms of the reference signals.

The method may include the depth corresponding to a number of devices of the circuit through which the target signal propagates.

The method may include modifying a presentation of the control object at a user interface, where the control object includes machine code corresponding to the target signal.

The method may include the presentation of the control object including a presentation of the machine code having a presentation format based on the metric.

The method may include the target signal and the reference signals each associated with a plurality of portions of the circuit having a structure to generate the target signal.

The method may include the reference signals including a subset of signals associated with each of the portions of the circuit having the structure to generate the target signal.

In yet another embodiment, a computer readable medium may include one or more instructions stored thereon and executable by a processor to identify, by the processor, a target signal among a plurality of signals propagating through a circuit, detect, by the processor, one or more reference signals associated with an input to the target signal, the reference signals satisfying a threshold based on a depth associated with the target signal and the circuit, generate, by the processor, a cross-correlation object between the target signal and the reference signals based on a waveform of the target signal and corresponding waveforms of the reference signals, generate, by the processor, a metric corresponding to a cross-correlation between at least a portion of the target signal and at least a portion of the cross-correlation object, modify, by the processor and based on the metric, a control object of the circuit, the control object being associated with the target signal, and modify, by the processor, a presentation of the control object at a user interface.

The computer readable medium may include one or more instructions executable by the processor to generate the cross-correlation object by combining the waveform of the target signal and the corresponding waveforms of the reference signals.

BRIEF DESCRIPTION OF THE DRAWINGS

These and other aspects and features of the present implementations will become apparent to those ordinarily skilled in the art upon review of the following description of specific implementations in conjunction with the accompanying figures, wherein:

FIG. 3 illustrates input waveforms and a target waveform of signals associated with the emulation structure of FIGS. 2A-C, according to an embodiment.

DETAILED DESCRIPTION

Figure 1:
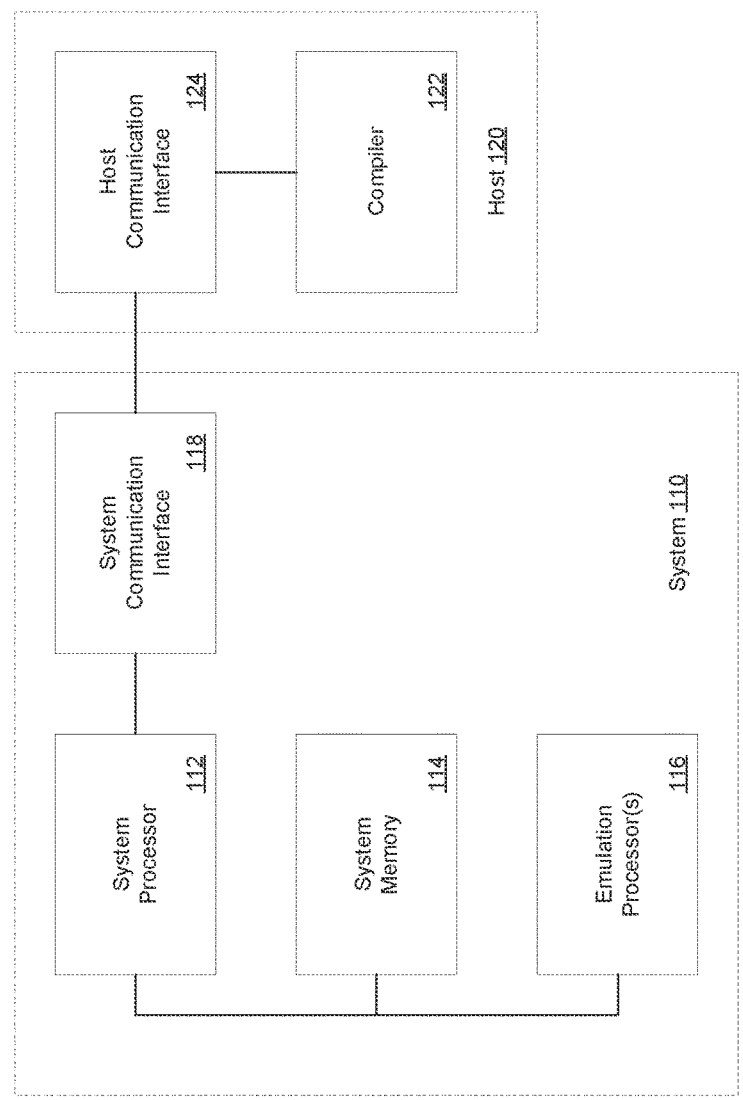
FIG. 1 illustrates an emulation system, according to an embodiment.

The present implementations will now be described in detail with reference to the drawings, which are provided as illustrative examples of the implementations so as to enable those skilled in the art to practice the implementations and alternatives apparent to those skilled in the art. Notably, the figures and examples below are not meant to limit the scope of the present implementations to a single implementation, but other implementations are possible by way of interchange of some or all of the described or illustrated elements. Moreover, where certain elements of the present implementations can be partially or fully implemented using known components, only those portions of such known components that are necessary for an understanding of the present implementations will be described, and detailed descriptions of other portions of such known components will be omitted so as not to obscure the present implementations. Implementations described as being implemented in software should not be limited thereto, but can include implementations implemented in hardware, or combinations of software and hardware, and vice-versa, as will be apparent to those skilled in the art, unless otherwise specified herein. In the present specification, an implementation showing a singular component should not be considered limiting; rather, the present disclosure is intended to encompass other implementations including a plurality of the same component, and vice-versa, unless explicitly stated otherwise herein. Moreover, applicants do not intend for any term in the specification or claims to be ascribed an uncommon or special meaning unless explicitly set forth as such. Further, the present implementations encompass present and future known equivalents to the known components referred to herein by way of illustration.

An emulation system can trace and identify target signals having anomalous behavior, activity, characteristics, or the like. The target signal can be based on the signal activity of distinct signals either directly or indirectly input to a component of a hardware device generating the target signal. The emulation system can identify a cross-correlation of the target signal activity to one or more, and preferably, a large number of, distinct signals, based on one or more matrix transformations, models trained by deep learning, models trained by machine learning, and the like. The cross-correlation of the signal can be associated with activity of the signals at a particular time, offset of times, or the like. The target signal can thus be correlated to a number of input signals either concurrently generated or generated at a particular previous time and offset to align with a relative timestamp or timestamps of the target signal in a propagation window thereof.

The emulation system can further generate one or more indications at a user interface based on a cross-correlation of the target signal to surrounding signals, based on one or more cross-correlation thresholds. The emulation system can advantageously communicate cross-correlation anomalies based on cross-correlation of many hundreds, thousands, millions, or more, of signals associated with a target signals, otherwise impossible to manually identify within an emulation system having signals numbering in the hundreds, thousands, millions, or more. The emulation system can thus advantageously eliminate the need of manually trace through individual signals within such a large search space, which would be impossible to perform and thus impossible to effectively resolve without the emulation system of present embodiments. Further, the emulation system can effectively communicate these identified anomalies effectively instantaneously or immediately, by identifying portions of machine code associated with the anomalous target signal activity. Thus, the emulation system can advantageously both identify anomalous target signal activity without the need to manually trace through a prohibitively large number of potential signals.

FIG. 1 illustrates an emulation system, according to an embodiment. As illustrated by way of example in FIG. 1, an emulation system 100 can include a system 110 and a host 120. The system 110 can include a system processor 112, a system memory 114, one or more emulation processors 116, and a system communication interface 118. The host 120 can include a compiler 122 and a host communication interface 124.

The system processor 112 can execute one or more instructions associated with the system 110. The system processor 112 can include an electronic processor, an integrated circuit, or the like including one or more of digital logic, analog logic, digital sensors, analog sensors, communication buses, volatile memory, nonvolatile memory, and the like. The system processor 112 can include, but is not limited to, at least one microcontroller unit (MCU), microprocessor unit (MPU), central processing unit (CPU), graphics processing unit (GPU), physics processing unit (PPU), embedded controller (EC), or the like. The system processor 112 can include a memory operable to store or storing one or more instructions for operating components of the system processor 112 and operating components operably coupled to the system processor 112. The one or more instructions can include at least one of firmware, software, hardware, operating systems, embedded operating systems, and the like. The system processor 112 or the system 112 generally can include at least one communication bus controller to effect communication between the system processor 112 and the other elements of the system 110.

The system memory 114 can store data associated with the system 110. The system memory 114 can include one or more hardware memory devices to store binary data, digital data, or the like. The system memory 114 can include one or more electrical components, electronic components, programmable electronic components, reprogrammable electronic components, integrated circuits, semiconductor devices, flip flops, arithmetic units, or the like. The system memory 114 can include at least one of a non-volatile memory device, a solid-state memory device, a flash memory device, and a NAND memory device. The system memory 114 can include one or more addressable memory regions disposed on one or more physical memory arrays. A physical memory array can include a NAND gate array disposed on, for example, at least one of a particular semiconductor device, integrated circuit device, and printed circuit board device.

The emulation processors 116 may execute one or more emulation instructions associated with corresponding parameters of a computing device or hardware system, for example. The emulation processors 116 may each include an electronic processor, an integrated circuit, or the like including one or more of digital logic, analog logic, digital sensors, analog sensors, communication buses, volatile memory, nonvolatile memory, and the like. The emulation processors 116 may each include one or more emulation cores, emulation registers, or emulation caches, for example, to execute the emulation instructions and perform a hardware-level emulation of a particular computing device or hardware system defined by the emulation instructions. The emulation processors 116 generally may each include at least one communication bus controller to effect communication between the emulation processors 116 and the other elements of the system 110. The emulation processors 116 may each include a processor memory that may store one or more instructions for operating components of a corresponding emulation processor 116 and operating components operably coupled to the corresponding emulation processor 116. The one or more instructions may include at least one of firmware, software, hardware, operating systems, embedded operating systems, emulation instructions and the like. The processor memory may receive emulation instructions and may store the emulation instructions at one or more memory locations of the processor memory. The processor memory may include one or more processor caches, or processor memory blocks, for example, that may operate at higher throughput, bandwidth, or the like, than the system memory 114. As one example, the processor memory may include at least one DDR memory.

The system communication interface 118 may communicatively couple the system 110 and the host 120, and may be integrated with the system 110. The system communication interface 118 may communicate one or more instructions, signals, conditions, states, or the like between one or more of the system 110 and the host 120. The system communication interface 118 may include one or more digital, analog, or like communication channels, lines, traces, or the like. As one example, the system communication interface 118 may include at least one high-bandwidth, serial or parallel communication line among multiple communication lines of a communication interface. The system communication interface 118 may include one or more wireless communication devices, systems, protocols, interfaces, or the like. The system communication interface 118 may include one or more logical or electronic devices including but not limited to integrated circuits, logic gates, flip flops, gate arrays, programmable gate arrays, and the like. The system communication interface 118 may include ones or more telecommunication devices including but not limited to antennas, transceivers, packetizers, and wired interface ports.

The compiler 122 may include one or more graphical user interfaces and one or more command line interfaces. The host communication interface 124 may communicatively couple the system 110 and the host 120, and may be integrated with the host 120. The host communication interface 124 may correspond at least partially in one or more of structure and operation to the system communication interface 130.

Figure 2A:
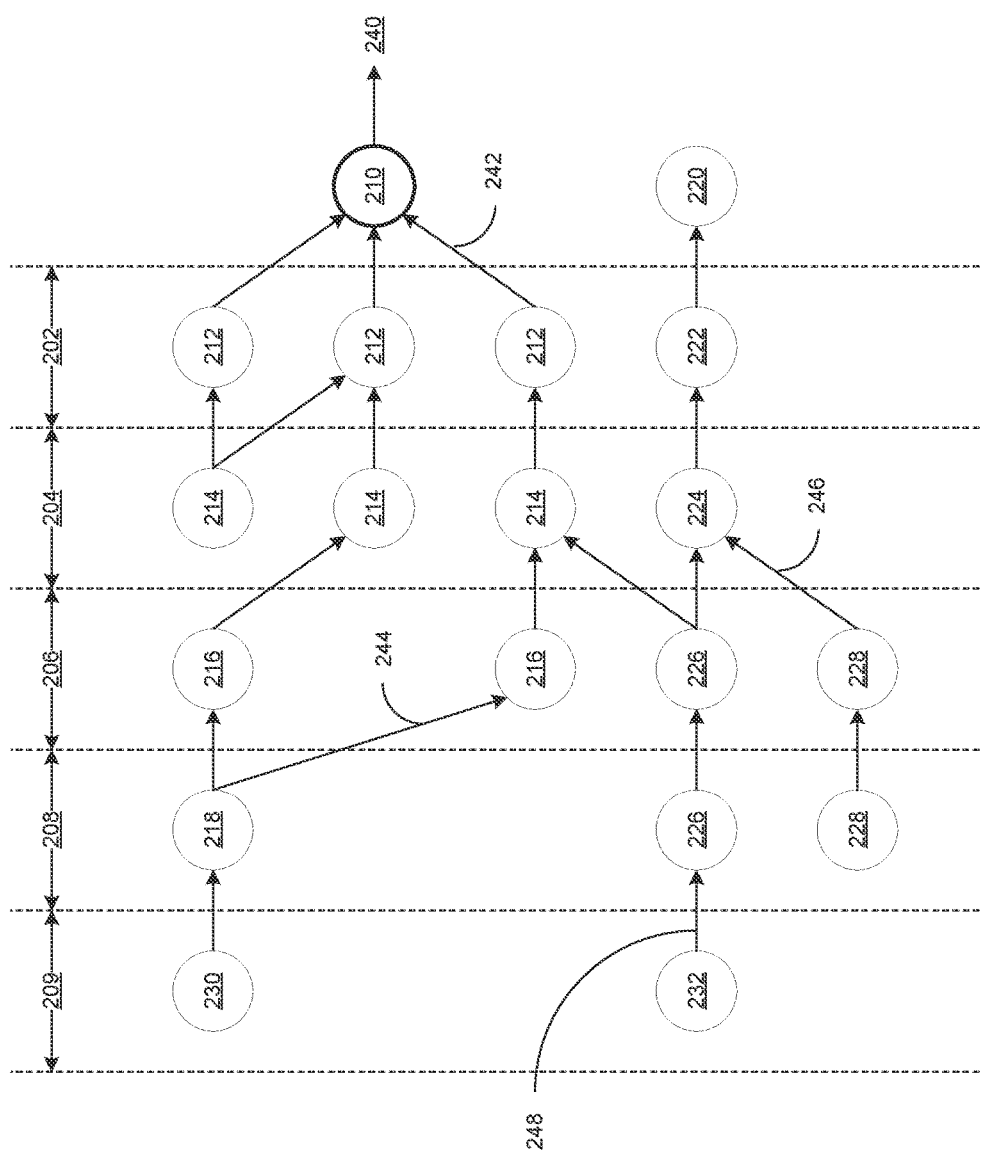
FIG. 2A illustrates an emulation structure propagating signals to a target signal, according to an embodiment.

FIG. 2A illustrates an emulation structure propagating signals to a target signal, according to an embodiment. As illustrated by way of example in FIG. 2A, an emulation structure 200A can include a target node 210, nodes 212, 214, 216, 218 and 230 associated with the target node 210, a non-target output node 220, and nodes 222, 224, 226, 228 and 232 associated with at least one of the target node 210 and the non-target output node 220. It is to be understood that each of the nodes can correspond to various electrical devices, electronic devices, logical devices, or the like. As one example, the nodes can correspond to various logical gates or gate arrays implemented in a computing device. Each of the nodes can further include one or more inputs and can perform one or more computational operations including operations associated with but not limited to logic gates and flip-flops. The emulation system can associate a depth 202, 204, 206, 208 and 209 with one or more of the nodes 212, 214, 216, 218, 222, 224, 226, 228, 230 and 232, based on at least one of a number of intervening nodes between a particular node and the target node 210.

The target node 210 can generate a target signal 240 associated with the target node. The target node 210 can generate a target signal 240 as output. The target signal 240 can include, for example, a digital or analog signal, and can have a waveform that varies over time. The nodes 212 can each be operatively coupled to one or more inputs of the target node 210, and can generate corresponding outputs receivable at one or more inputs of the target node 210. The nodes 212 can be associated with the depth 202 with respect to the target node 210. The depth 202 can correspond to a depth of 0, based on a lack of intervening nodes between the nodes 212 and the target node 210. The nodes 214 can each be operatively coupled to one or more inputs of the nodes 212, and can generate corresponding outputs receivable at one or more inputs of the nodes 212. The nodes 214 can be associated with the depth 204 with respect to the target node 210. The depth 204 can correspond to a depth of 1, based on one layer of intervening nodes between the nodes 214 and the target node 210. The nodes 216 can each be operatively coupled to one or more inputs of the nodes 214, and can generate corresponding outputs receivable at one or more inputs of the nodes 214. The nodes 216 can be associated with the depth 206 with respect to the target node 210. The depth 206 can correspond to a depth of 2, based on two layers of intervening nodes between the nodes 216 and the target node 210. The node 218 can be operatively coupled to one or more inputs of the nodes 216, and can generate a corresponding output receivable at one or more inputs of the nodes 216. The node 218 can be associated with the depth 208 with respect to the target node 210. The depth 208 can correspond to a depth of 3, based on three layers of intervening nodes between the node 218 and the target node 210. The node 230 can be operatively coupled to one or more inputs of the nodes 218, and can generate a corresponding output receivable at one or more inputs of the node 218. The node 230 can be associated with the depth 209 with respect to the target node 210. The depth 209 can correspond to a depth of 4, based on four layers of intervening nodes between the node 230 and the target node 210. The nodes 212, 216, 228 and 232 respectively at depths 202, 204, 206, and 209 can respectively generate output signals 242, 244, 246 and 248. The output signals 242, 244, 246 and 248 can each include, for example, a respective digital or analog signal, and can have respective waveforms that vary over time. At least a portion of the output signals 242, 244, 246 and 248 can be independent or interdependent.

Figure 2B:
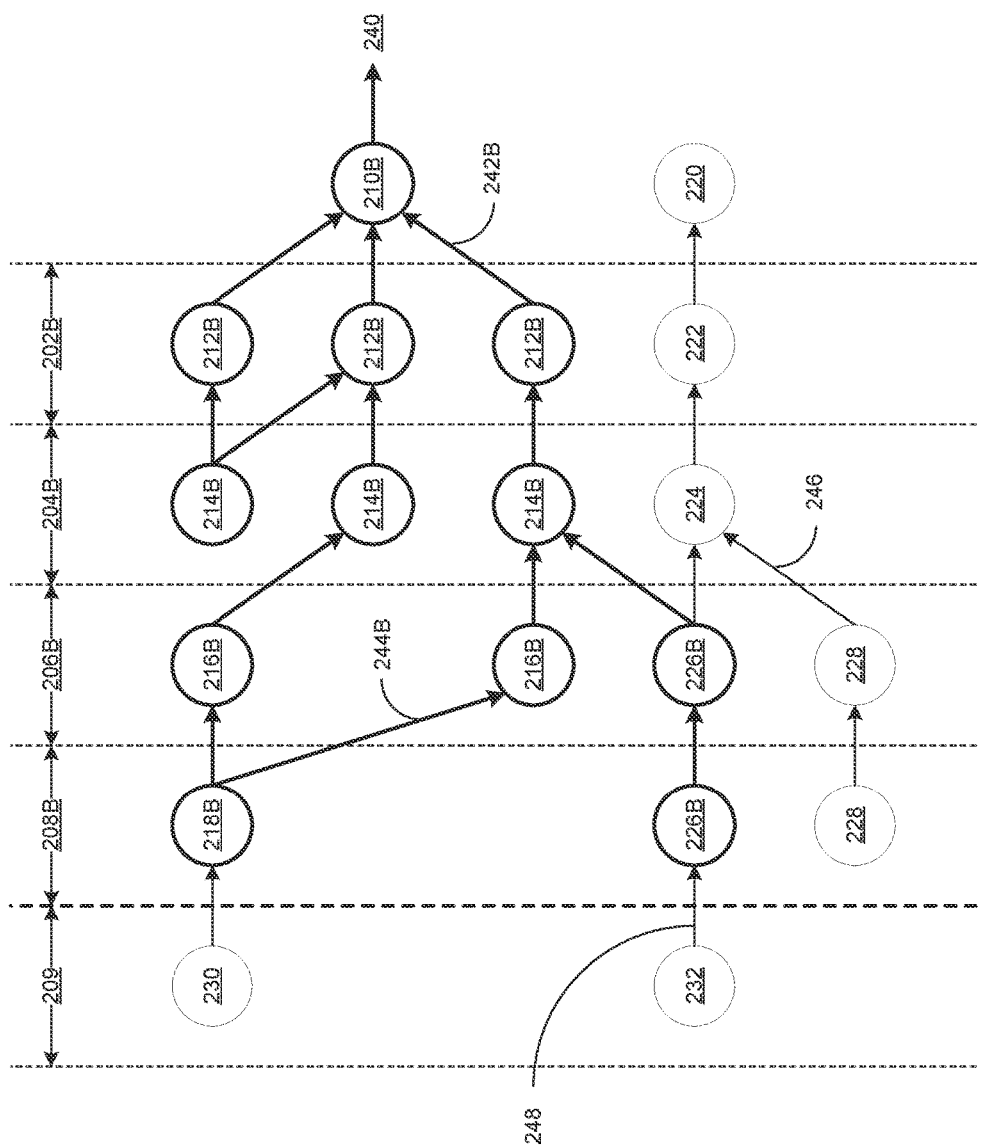
FIG. 2B illustrates the emulation structure of FIG. 2A having a first trace depth, according to an embodiment.

FIG. 2B illustrates the emulation structure of FIG. 2A having a first trace depth, according to an embodiment. As illustrated by way of example in FIG. 2B, an emulation structure 200B can include a target node 210B, nodes 212B, 214B, 216B, 218B and 230 associated with the target node 210B, the non-target output node 220, and the nodes 222, 224, 226, 228 and 232 associated with at least one of the target node 210B and the non-target output node 220. The nodes of the emulation structure 200B can correspond in one or more of structure and operation to the corresponding nodes of the emulation structure 200A. The emulation structure 200B can include a depth threshold of 4 with respect to the target node 210 generating the signal 240. The depths 202B, 204B, 206B and 208B can be included as input based on having depths less than or equal to the depth threshold.

The emulation structure 200B can be associated with a single trace depth, where the trace depth is associated with the target node 210B. Here, all of the nodes and their corresponding outputs that are eligible as input to generation of a cross-correlation object satisfy a depth threshold associated exclusively with the target node. As one example, the nodes 212B, 214B, 216B, 218B and 226B satisfy the depth threshold, and the nodes 222, 224, 228, 230 and 232 do not satisfy the depth threshold. Thus, the signals 242B and 244B are eligible as input to generation of a cross-correlation object, and signals 246 and 248 are not eligible as input to generation of the cross-correlation object.

Figure 2C:
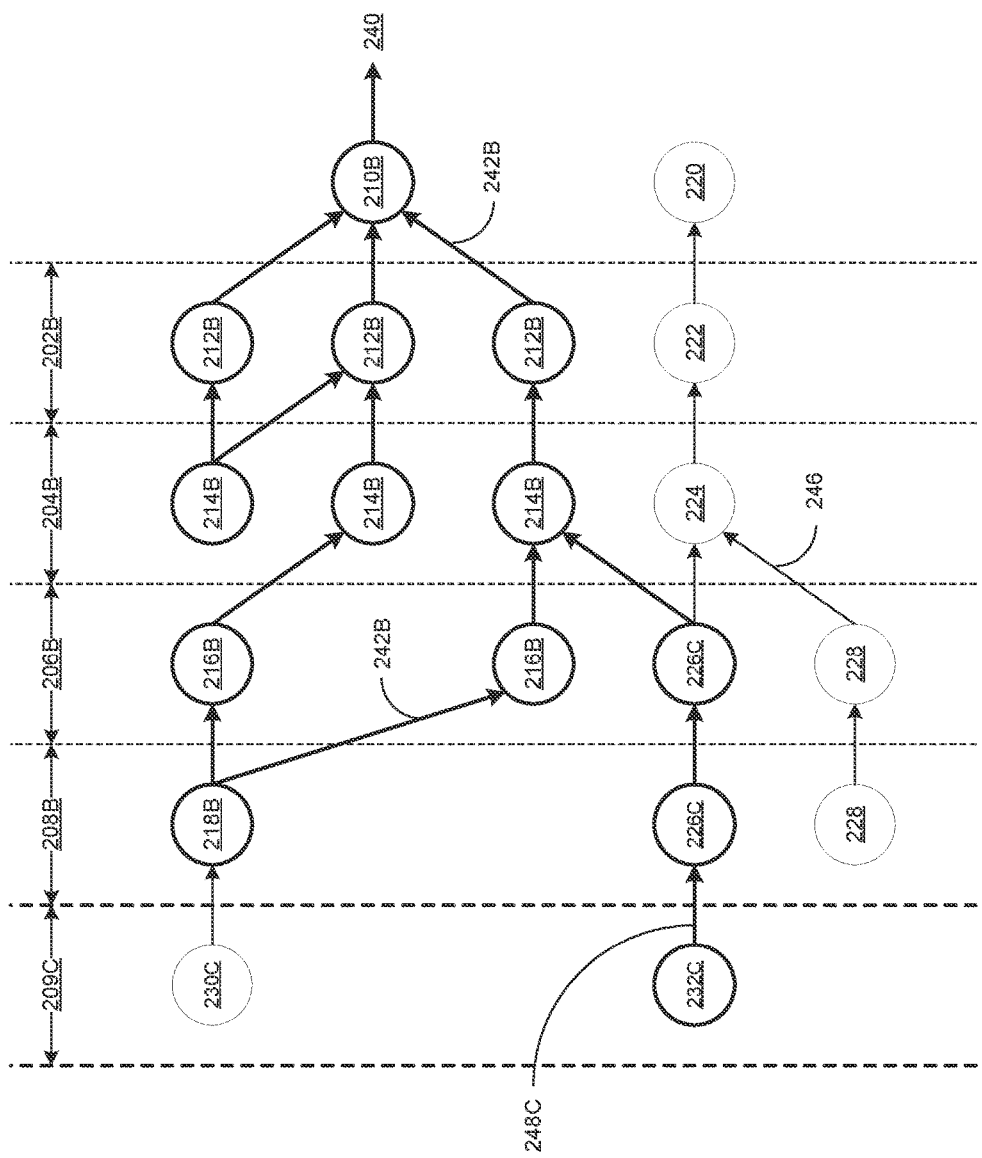
FIG. 2C illustrates the emulation structure of FIG. 2B having the first trace depth and a second trace depth, according to an embodiment.

FIG. 2C illustrates the emulation structure of FIG. 2B having the first trace depth and a second trace depth, according to an embodiment. As illustrated by way of example in FIG. 2C, an emulation structure 200C can include the target node 210B, the nodes 212B, 214B, 216B, 218B and node 230C associated with the target node 210B, the non-target output node 220, the nodes 222, 224, 226 and 228, and node 232C associated with at least one of the target node 210B and the non-target output node 220. The nodes of the emulation structure 200C can correspond in one or more of structure and operation to the corresponding nodes of the emulation structures 200A-B. The emulation structure 200C can include a first depth threshold of 4 with respect to the target node 210 generating the signal 240, and can include a second depth threshold of 1 with respect to the node 226C at depth 206B. The depths 202B, 204B, 206B and 208B can be included as input based on having depths less than or equal to the first depth threshold, and the depth 209C can be included as input based on having a depth less than or equal to the second depth threshold.

The emulation structure 200C can be associated with multiple trace depths, where the first trace depth is associated with the target node 210B and the second trace depth is associated with node 226C at the depth 206B. Here, all of the nodes and their corresponding outputs that are eligible as input to generation of a cross-correlation object satisfy at least one of the two depth thresholds associated respectively with the target node 210B or the node 226C at the depth 206B. As one example, the nodes 212B, 214B, 216B, 218B and 226B satisfy the first depth threshold, the nodes 226C and 232C satisfy the second depth threshold, and the nodes 222, 224, 228 and 230C do not satisfy either of the first or second depth thresholds. Thus, the signals 242B, 244B and 248C are eligible as input to generation of a cross-correlation object, and the signal 246 is not eligible as input to generation of the cross-correlation object.

FIG. 3 illustrates input waveforms and a target waveform of signals associated with the emulation structure of FIGS. 2A-C, according to an embodiment. As illustrated by way of example in FIG. 3, a waveform diagram 300 can include an input waveform window 302 and a target waveform window 304. The input waveform window 302 can include input waveforms 310, 320 and 330. The target waveform window 304 can include a target waveform 340. The waveform windows 302 and 304 can be associated with one or more edge timepoints 350, 352 and 354.

The input waveforms 310, 320 and 330 can include one or more analog or digital waveforms associated with the target waveform 340, and can include direct or indirect input to a hardware device or emulated hardware device, for example, operable to generate the target waveform 340. The input waveforms 310, 320 and 330 can include time-series signals, and can be variable over time in accordance with one or more signal patterns. As one example, the input waveform 310 can have a sawtooth pattern with a linear ramp up and linear ramp down, the input waveform 320 can have a nonlinear decay pattern with a linear ramp up, and an input waveform 330 can have an instantaneous square wave pattern. It is to be understood that the number and types of waveforms illustrated herein by way of example are not limiting, and that present implementations can include any number and type of input waveforms. As one example, the number of input waveforms associated with the target waveform 340 can be in the hundreds, thousands, millions, or more.

Each of the input waveforms can define one or more edge timepoints among the edge timepoints 350, 352 and 354 based on a rising edge or a falling edge of the input signal. Thus, present implementations can advantageously identify and extract values associated with one or more input waveforms and target waveforms at the edge timepoints 350, 352 and 354. Thus, present implementations can advantageously reduce and optimize a search space from which a cross-correlation object is generated, by extracting characteristics of the input waveforms at the edge timepoints. This way, present implementations can extract cross-correlations between patterns and can reduce cumulative data points obtained at periods of stability or inactivity, for example, in the input waveforms. Generating cross-correlation based on edge timepoints is particularly advantageous for high-activity signals that provide many transition points by rising and falling edges and thus generate many inputs over short periods of time to generate a cross-correlation object. The input waveforms 310, 320 and 330 can each correspond to a respective signal among the signals 242, 244 and 248 of FIGS. 2A-C.

The target waveform 340 can include one or more analog or digital waveforms associated with the input waveforms 310, 320 and 330, and can include direct or indirect output of a hardware device or emulated hardware device, for example, operable to generate the target waveform 340. The target waveform 340 can include time-series signals, and can be variable over time in accordance with one or more signal patterns. As one example, the target waveform 340 can have a sawtooth pattern with a linear ramp up and linear ramp down. It is to be understood that the types of waveform illustrated herein by way of example is not limiting, and that present implementations can include any type of target waveform. The target waveform 340 can be aligned with or time-shifted from the input waveforms 310, 320 and 330 by the edge timepoints 350, 352 and 354. Thus, the input waveform window 302 and the target waveform window 304 can include waveforms having behavior occurring simultaneously. The input waveforms 310, 320 and 330 can be captured before or after their signals have propagated through to the target waveform 340. As one example, the input waveforms 310, 320 and 330 at edge timepoints 350 can propagate through a circuit to affect generation of the target waveform 340 at edge timepoints 352. As another example, the input waveforms 310, 320 and 330 at edge timepoints 350 can propagate more rapidly through a circuit to affect generation of the target waveform 340 at edge timepoints 350. As another example, the input waveforms 310, 320 and 330 at edge timepoints 350 can propagate more slowly through a circuit to affect generation of the target waveform 340 at edge timepoints 354.

Figure 4A:
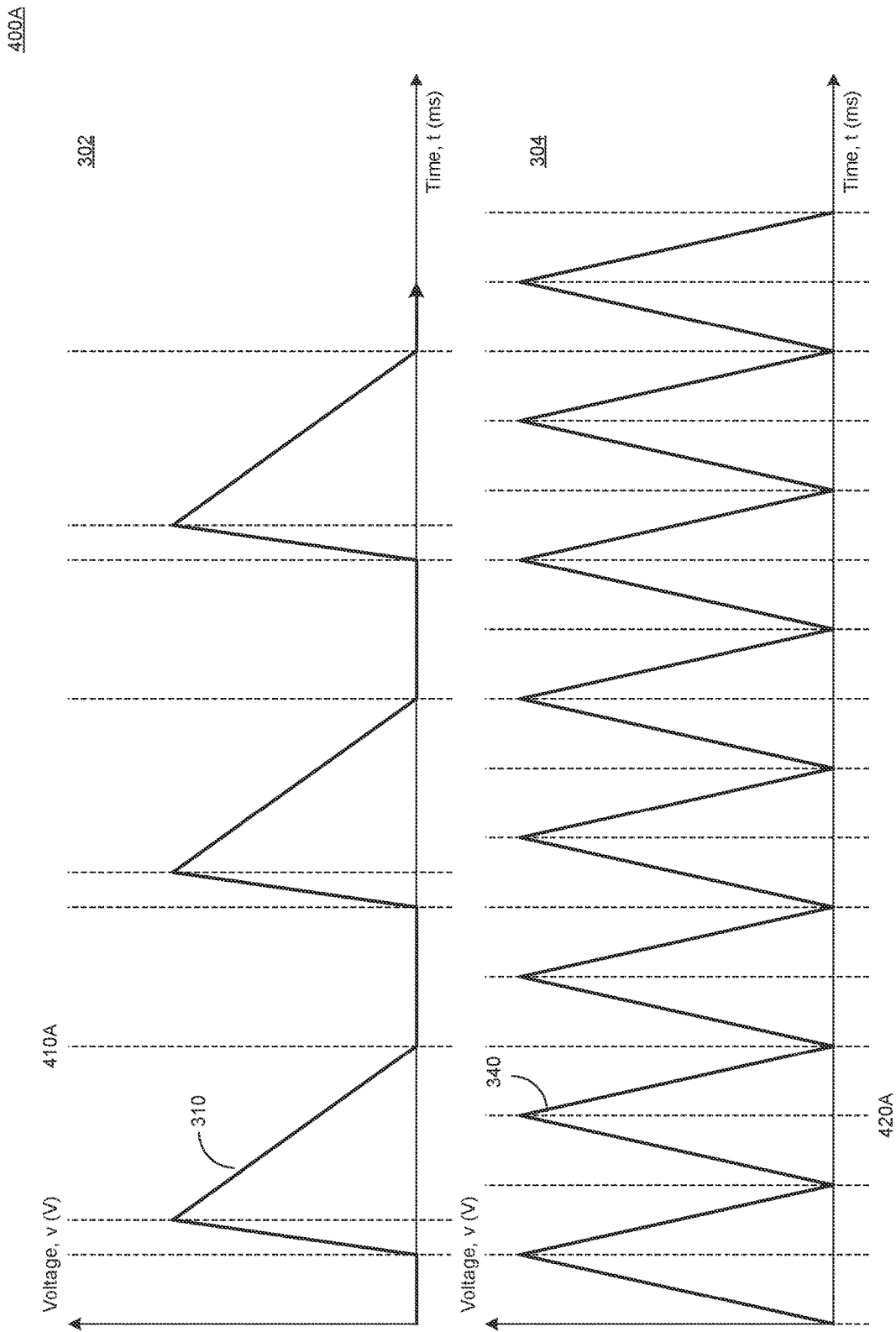
FIG. 4A illustrates an input waveform and a target waveform of signals associated with corresponding discrete frequencies and the emulation structure of FIGS. 2A-C, according to an embodiment.

FIG. 4A illustrates an input waveform and a target waveform of signals associated with corresponding discrete frequencies and the emulation structure of FIGS. 2A-C, according to an embodiment. As illustrated by way of example in FIG. 4A, a waveform diagram 400A can include the input waveform window 302 and the target waveform window 304. The input waveform window 302 can include the input waveform 310 and can be associated with one or more timepoints 410A. The target waveform window 402 can include the target waveform 340 and can be associated with one or more timepoints 420A. The timepoints 410A can correspond to one or more of edges and peaks, for example, associated with the input waveform 310. The timepoints 420A can correspond to one or more of edges and peaks, for example, associated with the target waveform 340. Thus, the input waveform 310 can be associated with a first discrete frequency having a first activity level, based on the timepoints 410A. The first activity level can correspond to a number of timepoints 410A within a particular time period. The target waveform 340 can also be associated with a second discrete frequency having a second activity level, based on the timepoints 420A. The second activity level can correspond to a number of timepoints 420A within a particular time period, corresponding to a similar time period associated with the input waveform 310.

The target waveform 340 can include one or more analog or digital waveforms associated with the input waveforms 310, 320 and 330, and can include direct or indirect output of a hardware device or emulated hardware device, for example, operable to generate the target waveform 340. The target waveform 340 can be associated with activity of the target waveform 340 that is expected or corresponds to normal operation, for example, during operation of the circuit. The target waveform 340 can also or alternatively be associated with activity of the target waveform 340 that is uncommon or unusual, for example, during operation of the circuit. As one example, uncommon or unusual activity can be activity that occurs during less than 1% of operation of the circuit. The level of activity corresponding to uncommon or unusual activity is not limited to the examples discussed or illustrated herein. Thus, the target waveform 340 having expected activity can be differentiated from the target waveform having uncommon activity based on the frequency or percentage of activity during operation exhibiting a particular pattern of activity.

Similarly, an anomalous portion can be identified based on the frequency or percentage of activity during operation exhibiting a particular pattern of activity. The anomalous portion can be further differentiated based on the edge timepoints 410A and 420A. The edge timepoints 410A and 420A can be from among the edge timepoints 302, 304 and 306, and can define boundaries of an anomalous region. The anomalous region can be defined to have a predetermined minimum size. As one example, anomalous activity within various ones of edge timepoints 410A and 420A corresponding to a time period less than a threshold time period will not be identified as anomalous. Such anomalous activity can be considered too fleeting or temporary to be identified.

Figure 4B:
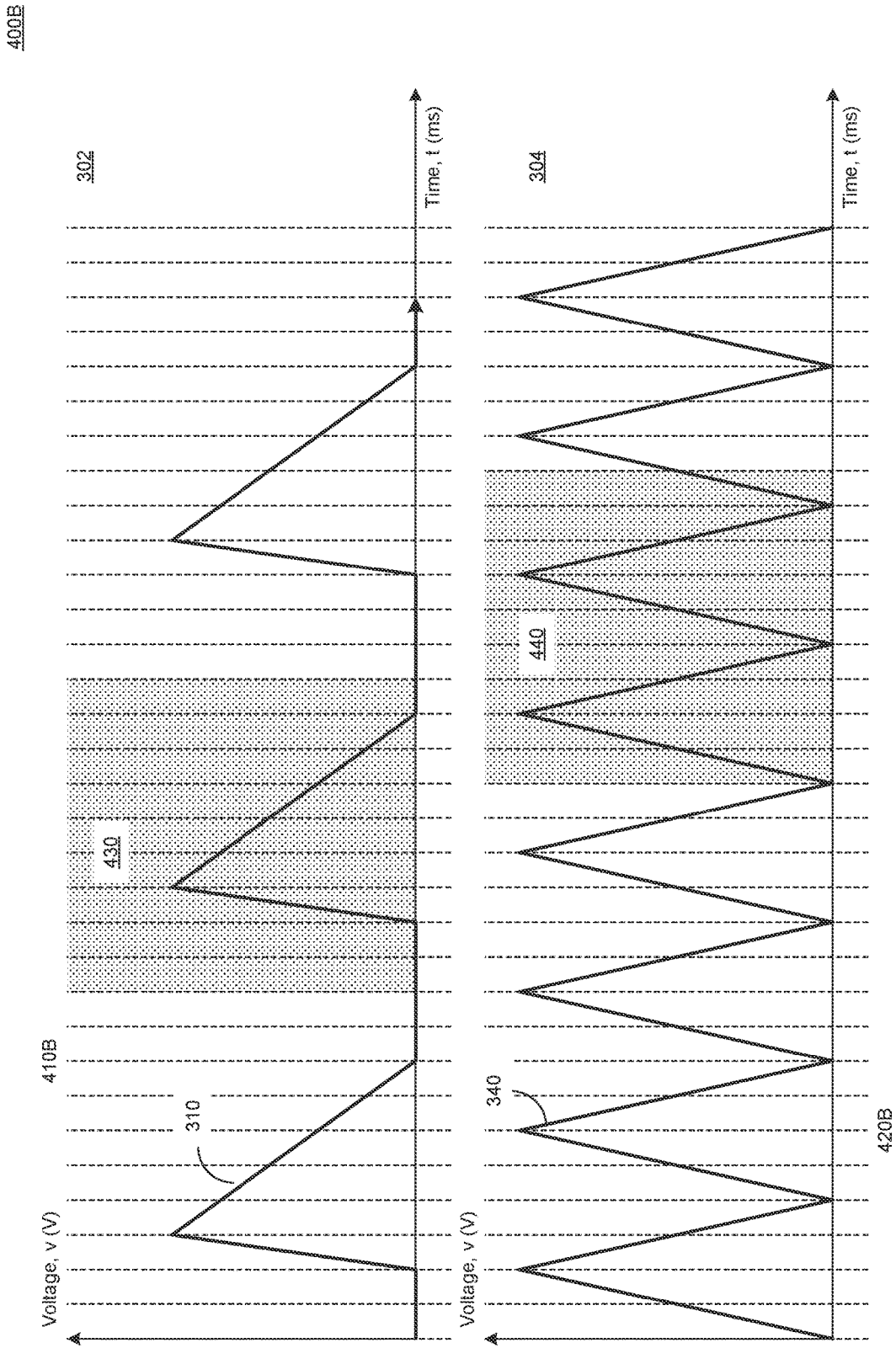
FIG. 4B illustrates an input waveform and a target waveform of signals associated with a discrete sampling frequency and the emulation structure of FIGS. 2A-C, according to an embodiment.

FIG. 4B illustrates an input waveform and a target waveform of signals associated with a discrete sampling frequency and the emulation structure of FIGS. 2A-C, according to an embodiment. As illustrated by way of example in FIG. 4B, a waveform diagram 400B can include the input waveform window 302 and the target waveform window 304. The input waveform window 302 can include the input waveform 310 and can be associated with one or more sampling timepoints 410B and an activity window 430. The target waveform window 402 can include the target waveform 340 and can be associated with one or more sampling timepoints 420B and an activity window 440.

The sampling timepoints 410B and the sampling timepoints 420B can be generated based on at least one of the input waveform 310 and the target waveform 340. The sampling timepoints can correspond to a sampling frequency to detect discrete time features in both the input waveform 310 and the target waveform 340. As one example, a system in accordance with present implementations can identify which of the input waveform 310 and the target waveform 340 has a higher activity level. In this example, the target waveform 340 has a higher activity level than the input waveform 310. The system can generate sampling timepoints 410B and 420B based on the timepoints of the waveform having the higher activity level. Here, the discrete sampling frequency can be based on the timepoints of the target waveform 340. Further, the system can increase the number of timepoints or the frequency of timepoints, for example, to increase the likelihood that features of various waveforms are detected. The increase can be based on the frequency or activity level, for example, of the higher activity signal. As one example, the increase can be a doubling of the frequency, in accordance with a Nyquist frequency. Thus, the sampling timepoints 410B and the sampling timepoints 420B can correspond to an increased frequency based on an activity level of the target waveform 340. The system can conduct a pairwise cross-correlation between any number of pairs of signals, including into the hundreds, thousands, and millions of pairs of signals, or more.

The activity windows 430 and 440 can correspond to portions of the input waveform 310 and the target waveform 340, respectively. As one example, the activity window 430 can be time-shifted from the activity windows 440, to align the activity windows with respect to propagation of one or more inputs including the input waveform 310 to the target waveform 340. An activity window bounded by various timepoints is not limited to an anomalous region as discussed above, and can enclose any portion of one or more target signals and input signals. Thus, the activity window can advantageously increase speed of detection of anomalous activity by reducing the signal search space to timepoints associated with the activity window. An activity window associated with a target signal can also be associated with an activity window of at least one input signal. A reduction of time for detecting anomalous activity can at least enable user interface feedback indicating commands resulting in anomalous code, that would otherwise not be executable at a rapid enough pace to be presentable on a user interface and to be information for during software development. Thus, the reduction of time can directly improve at least compiler devices and systems.

Figure 5:
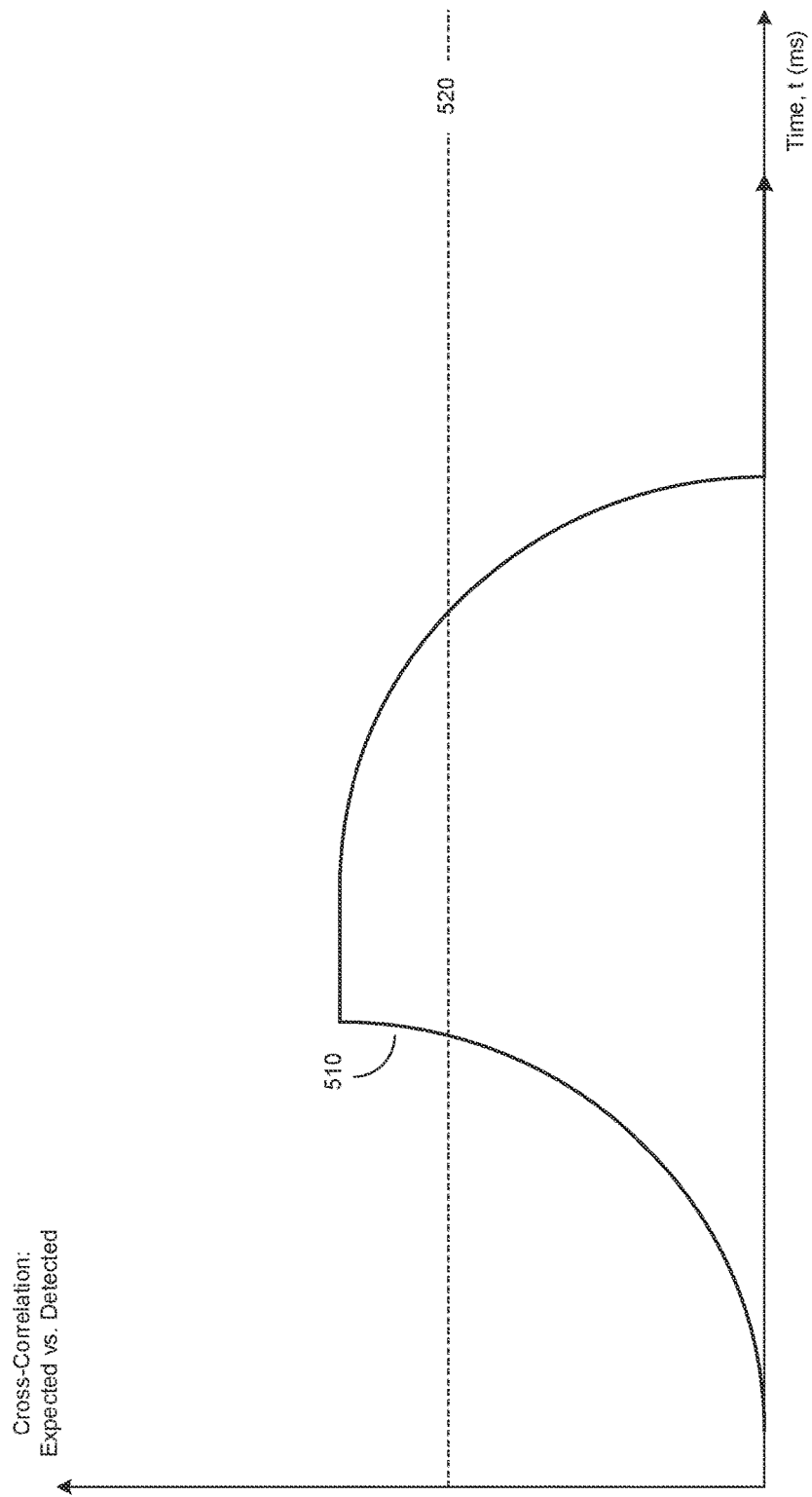
FIG. 5 illustrates a cross-correlation object based on various waveforms of signals associated with the emulation structure of FIGS. 2A-C, according to an embodiment.

FIG. 5 illustrates a cross-correlation object based on various waveforms of signals associated with the emulation structure of FIGS. 2A-C, according to an embodiment. As illustrated by way of example in FIG. 5, a waveform diagram 500 can include a cross-correlation waveform 510 and a threshold 520. The waveform 510 can be associated with or within, for example, an activity window. The threshold 520 can correspond to a threshold metric of a cross-correlation waveform.

At least one system processor 112 and one or more of the emulation processors 116 can generate the cross-correlation waveform 510. The system processor 112 or the emulation processors 116 can generate cross-correlation objects based on one or more transformations associated with one or more input waveforms, for example. The transformation can include one or more matrix operations to identify cross-correlated activity between one or more input signals and target signals. The transformation can include a machine learning model, deep learning model, or the like, trained with input from the emulation processors. The input from the emulation processors 116 can include one or more of input waveforms, target waveforms, and anomalous target waveforms. Values of the cross-correlation object waveforms can correspond to metrics output by any model trained with input from the input waveforms. The system processor 112 can execute the trained machine learning model, deep learning model, or the like, in accordance with a model stored at the system memory 114 and including the trained machine learning model, deep learning model, or the like. The model can advantageously support pattern recognition and anomaly detection in circuits having hundreds, thousands, millions, or more signals as discussed herein. The threshold 520 can be associated with a particular cross-correlation, and can correspond to a scalar value between 0 and 1. As one example, a scalar value of 0 can indicate minimal or no correlation, and a scalar value of 1 can indicate maximum of exact correlation. It is to be understood that the threshold 510 is not limited to the scalar values indicated above.

Figure 6:
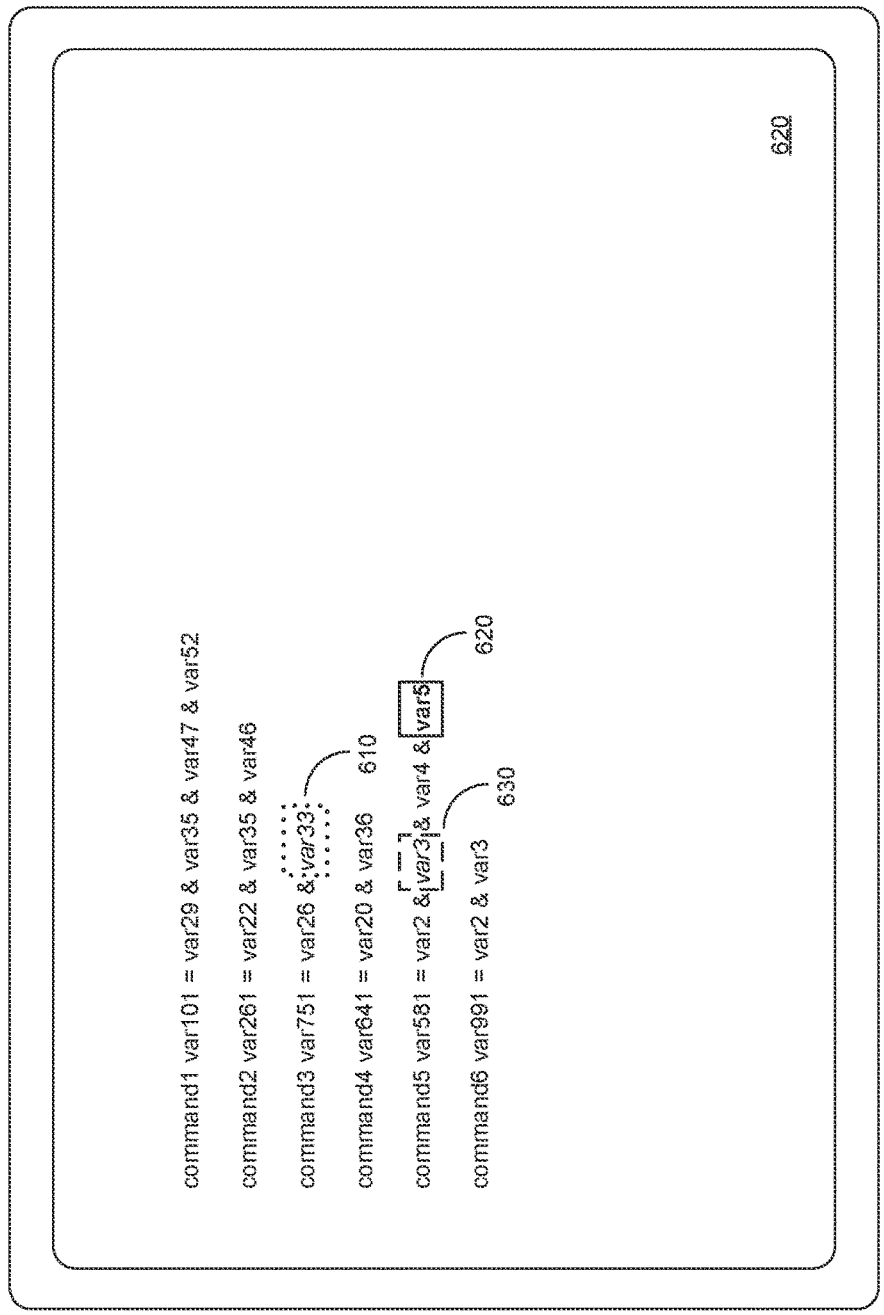
FIG. 6 illustrates a presentation of a control object at a user interface associated with the emulation system, according to an embodiment.

FIG. 6 illustrates a presentation of a control object at a user interface associated with the emulation system, according to an embodiment. As illustrated by way of example in FIG. 6, a user interface 600 can include a display device 610 including a presentation portion 620. The display device 610 can display at least one or more outputs of the compiler 122, and can include an electronic display. An electronic display can include, for example a liquid crystal display (LCD), a light-emitting diode (LED) display, an organic light-emitting diode (OLED) display, or the like. The display device 610 can be housed at least partially within the host 120.

The presentation portion 620 can present at least one or more instructions executable by one or more of the emulation processors 116 to effect operation of a circuit thereby. The Instructions can include one or more machine code objects 610, 620 and 630. The machine code objects 610, 620 and 630 can be associated with various nodes of an emulation structure or signals of an emulation structure in accordance with FIGS. 2A-C. Each of the machine code objects 610, 620 and 630 can be presented in accordance with one or more formats. The formats can control presentation of the machine code objects 610, 620 and 630. As one example, formats can include one or more of font, font size, font weight, font style, font color, font transparency, background color, background transparency, and background pattern. The formats can be changed based on one or more of the cross-correlation thresholds 530, 532 and 534, for example. Each of the machine code objects 610, 620 and 630 can be associated with a particular target signal, and can each be associated with a distinct target signal. Thus, present implementations can advantageously concurrently or simultaneously present indications of target signal cross-correlation for multiple target signals. Present implementations can further advantageously present indications of values of multiple target signals concurrently or simultaneously. The indications of values of target signals can be based at least partially on at least one of the formats discussed herein, and can correspond to particular timepoints or ranges of timepoints, for example. As one example, machine code objects 610, 620 and 630 can be associated with different cross-correlation thresholds and formats corresponding to those thresholds. Here, the formats can include a first background color satisfying the first cross-correlation threshold 530, a second background color satisfying the second cross-correlation threshold 532, and a third background color satisfying the third cross-correlation threshold 532. As one example, the first background color can include green, the second background color can include yellow, and the third background color can include red. Thus, the background colors, or other formats can indicate a band between thresholds associated with a particular range of cross-correlation percentages or the like. It is to be understood that the indication of values can actively change in accordance with a time-series simulation. As one example, the colors can change as the circuit is executed by the emulation processors and various target signals move in and out of anomalous activity satisfying one or more of the cross-correlation thresholds, if any.

Figure 7:
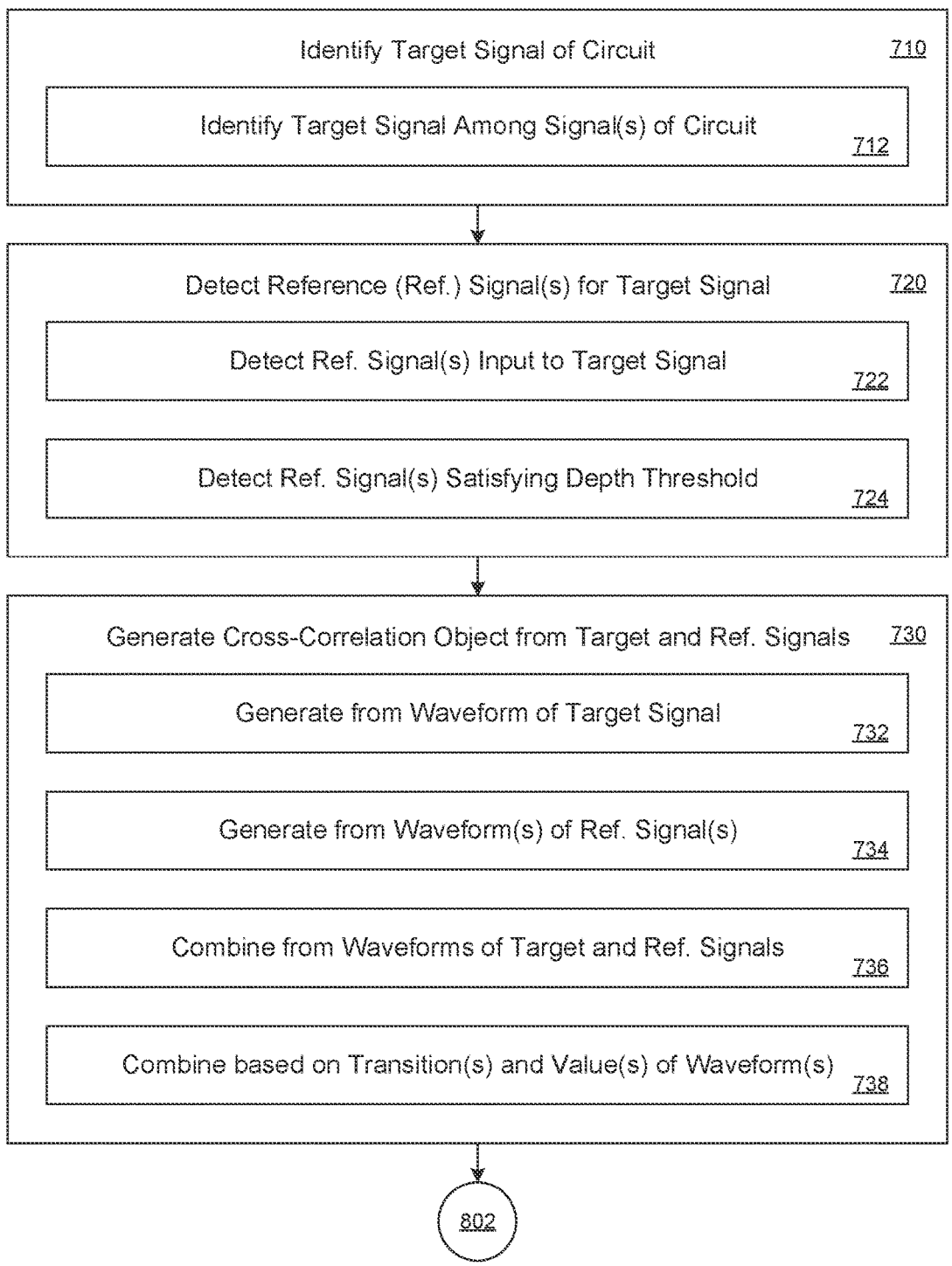
FIG. 7 illustrates a method of tracing and identifying target signals by cross-correlation to a signal pattern for a circuit, according to an embodiment.

FIG. 7 illustrates a method of tracing and identifying target signals by cross-correlation to a signal pattern for a circuit, according to an embodiment. The example system 100 can perform method 700 according to present implementations. The method 700 can begin at step 710.

At step 710, the method can identify at least one target signal associated with a circuit. Step 710 can include step 712. At step 712, the method can identify at least one target signal among a plurality of signals associated with a circuit. The method 700 can then continue to step 720.

At step 720, the method can detect one or more reference signals corresponding to the target signal. The reference signals and correspond to one or more of the input signals discussed herein. Step 720 can include at least one of steps 722 and 724. At step 722, the method can detect one or more reference signals received as input to the target signal. The reference signals can be provided as outputs from one or more nodes to inputs of a target node. The target node can then generate the target signal based at least partially on one or more of the references signals received at the target node. At step 724, the method can detect one or more reference signals satisfying a depth threshold. The depth threshold can correspond to a number of intervening nodes with respect to a target node or a node associated with the target node. The method 700 can then continue to step 730.

At step 730, the method can generate at least one cross-correlation object based on one or more of the target signal and one or more of the reference signals. The system processor 112 can generate the cross-correlation object in accordance with any model discussed herein, for example. The model can be trained with input from one or more of the emulation processors as discussed herein. Step 730 can include at least one of steps 732, 734, 736 and 738. At step 732, the method can generate the cross-correlation object based at least partially on at least a portion of a waveform associated with the target signal. At step 734, the method can generate the cross-correlation object based at least partially on at least a portion of one or more waveforms respectively associated with one or more of the reference signals. At step 736, the method can generate the cross-correlation object by combining the waveform of the target signal and the corresponding waveforms of the reference signals. At step 738, the method can generate the cross-correlation object by combining the waveform of the target signal and the corresponding waveforms of the reference signals, based at least partially on one or more of transitions and values of the waveforms of the target signal or the waveforms of the reference signals. The method 700 can then continue to step 802.

Figure 8:
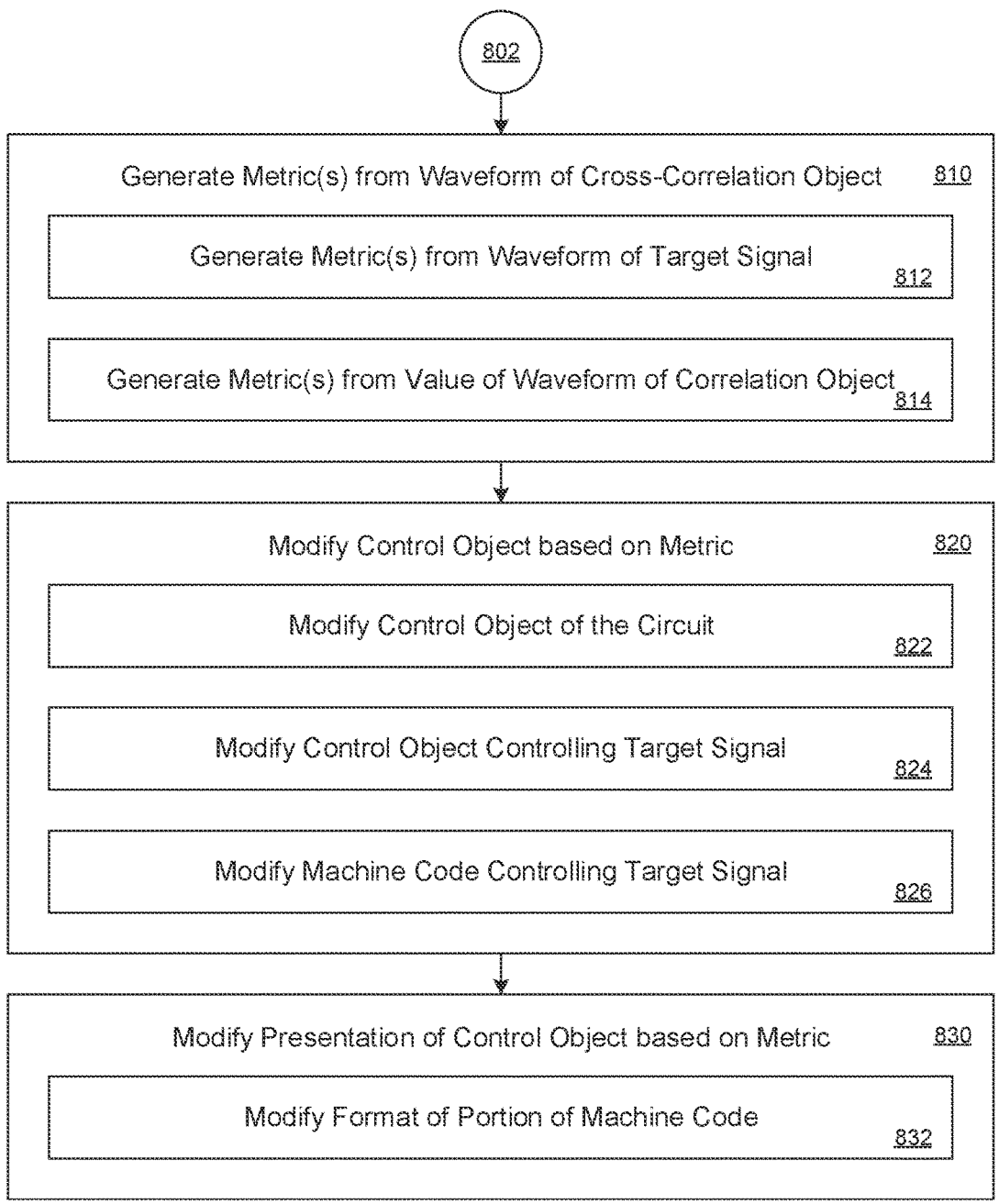
FIG. 8 illustrates the method of tracing and identifying target signals by cross-correlation to a signal pattern for a circuit, further to the example method of FIG. 7, according to an embodiment.

FIG. 8 illustrates the method of tracing and identifying target signals by cross-correlation to a signal pattern for a circuit, further to the example method of FIG. 7. The example system 100 can perform method 800 according to present implementations. The method 800 can begin at step 802. The method 800 can then continue to step 810.

At step 810, the method can generate one or more metrics based at least partially on a waveform associated with the cross-correlation object. The metrics can correspond to a particular value of a waveform associated with the cross-correlation object at a particular time. As one example, a metric can indicate a particular value of a cross-correlation object at a particular time. The particular value can correspond to a cross-correlation percentage, and can potentially satisfy any cross-correlation threshold. The system processor 112 can generate the metrics in accordance with or based at least partially on an output of any model discussed herein, for example. Step 810 can include at least one of steps 812 and 814. At step 812, the method can generate one or more metrics based on the waveform of the target signal. At step 814, the method can generate one or more metrics based on one or more values of the waveform of the cross-correlation object. The method 800 can then continue to step 820.

At step 820, the method can modify at least one control object based on the metric. The control object can correspond to at least one of the machine code objects 610, 620 and 630. The method can further modify the at least one control object iteratively, repeatedly, continuously, or the like, with respect to an active time-series operation of the circuit by the emulation processors as discussed above. Step 820 can include at least one of steps 822, 824 and 826. At step 822, the method can modify at least one control object associated with a circuit. At step 824, the method can modify at least one control object controlling the target signal. At step 826, the method can modify at least one control object associated with machine code controlling the target signal. The method 800 can then continue to step 830.

At step 830, the method can modify at least one presentation of a control object based on the metric. Step 830 can include step 832. At step 832, the method can modify at least one format associated with at least a portion of machine code. The method 800 can end at step 832. It is to be understood that present implementations are not limited to the particular examples disclosed herein. It is to be further understood that present implementations can include, but are not limited to jitter analysis, clock frequency analysis, and the like.

The herein described subject matter sometimes illustrates different components contained within, or connected with, different other components. It is to be understood that such depicted architectures are illustrative, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality, and any two components capable of being so associated can also be viewed as being "operably couplable," to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.).

Although the figures and description may illustrate a specific order of method steps, the order of such steps may differ from what is depicted and described, unless specified differently above. Also, two or more steps may be performed concurrently or with partial concurrence, unless specified differently above. Such variation may depend, for example, on the software and hardware systems chosen and on designer choice. All such variations are within the scope of the disclosure. Likewise, software implementations of the described methods could be accomplished with standard programming techniques with rule-based logic and other logic to accomplish the various connection steps, processing steps, comparison steps, and decision steps.

It will be further understood by those within the art that if a specific number of an introduced claim recitation is intended, such an intent will be explicitly recited in the claim, and in the absence of such recitation, no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations).

Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general, such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

Further, unless otherwise noted, the use of the words "approximate," "about," "around," "substantially," etc., mean plus or minus ten percent.

The foregoing description of illustrative implementations has been presented for purposes of illustration and of description. It is not intended to be exhaustive or limiting with respect to the precise form disclosed, and modifications and variations are possible in light of the above teachings or may be acquired from practice of the disclosed implementations. It is intended that the scope of the invention be defined by the claims appended hereto and their equivalents.

What is claimed is:

1. A system to trace and identify target signals by cross-correlation to a signal pattern for a circuit, the system comprising:
   a data processing system comprising memory having machine-executable instructions stored thereon that when executed by one or more processors cause the one or more processors to:
      identify a target signal among a plurality of signals propagating through a circuit;
      detect one or more reference signals associated with an input to the target signal, the reference signals satisfying a threshold based on a depth associated with the target signal and the circuit;
      generate a cross-correlation object between the target signal and the reference signals based on a waveform of the target signal and corresponding waveforms of the reference signals;
      generate a metric corresponding to a cross-correlation between at least a portion of the target signal and at least a portion of the cross-correlation object; and
      modify, based on the metric, a control object of the circuit, the control object being associated with the target signal; and
   modify a presentation of the control object at a graphical user interface.

2. The system of claim 1, wherein the cross-correlation object is based on at least one transition of at least one of the target signal and at least one transition of at least one of the reference signals at a cross-correlation timepoint.

3. The system of claim 1, wherein the cross-correlation object is based on at least one value of at least one of the target signal and at least one value of at least one of the reference signals at a cross-correlation timepoint.

4. The system of claim 1, the data processing system further configured to:
   generate the cross-correlation object by combining the waveform of the target signal and the corresponding waveforms of the reference signals.

5. The system of claim 1, wherein the depth corresponds to a number of devices of the circuit through which the target signal propagates.

6. The system of claim 1, the data processing system further configured to:
    modify a presentation of the control object at a user interface,
    wherein the control object comprises machine code corresponding to the target signal.

7. The system of claim 6, wherein the presentation of the control object comprises a presentation of the machine code having a presentation format based on the metric.

8. The system of claim 1, wherein the target signal and the reference signals are associated with a plurality of portions of the circuit having a structure to generate the target signal.

9. The system of claim 8, wherein the reference signals comprise a subset of signals associated with each of the portions of the circuit having the structure to generate the target signal.

10. A method of tracing and identifying target signals by cross-correlation to a signal pattern for a circuit, the method comprising:
    identifying a target signal among a plurality of signals propagating through a circuit;
    detecting one or more reference signals associated with an input to the target signal, the reference signals satisfying a threshold based on a depth associated with the target signal and the circuit, and being shifted with respect to the target signal;
    generating a cross-correlation object between the target signal and the reference signals based on a waveform of the target signal and corresponding waveforms of the reference signals;
    generating a metric corresponding to a cross-correlation between at least a portion of the target signal and at least a portion of the cross-correlation object; and
    modifying, based on the metric, a control object of the circuit, the control object being associated with the target signal; and
    modify a presentation of the control object at a graphical user interface.

11. The method of claim 10, wherein the cross-correlation object is based on at least one transition of at least one of the target signal and at least one transition of at least one of the reference signals at a cross-correlation timepoint.

12. The method of claim 10, wherein the cross-correlation object is based on at least one value of at least one of the target signal and at least one value of at least one of the reference signals at a cross-correlation timepoint.

13. The method of claim 10, further comprising:
    generating the cross-correlation object by combining the waveform of the target signal and the corresponding waveforms of the reference signals.

14. The method of claim 10, wherein the depth corresponds to a number of devices of the circuit through which the target signal propagates.

15. The method of claim 10, further comprising:
    modifying a presentation of the control object at a user interface,
    wherein the control object comprises machine code corresponding to the target signal.

16. The method of claim 15, wherein the presentation of the control object comprises a presentation of the machine code having a presentation format based on the metric.

17. The method of claim 10, wherein the target signal and the reference signals are each associated with a plurality of portions of the circuit having a structure to generate the target signal.

18. The method of claim 17, wherein the reference signals comprise a subset of signals associated with each of the portions of the circuit having the structure to generate the target signal.

19. A computer readable medium including one or more instructions stored thereon and executable by a processor to:
    identify, by the processor, a target signal among a plurality of signals propagating through a circuit;
    detect, by the processor, one or more reference signals associated with an input to the target signal, the reference signals satisfying a threshold based on a depth associated with the target signal and the circuit;
    generate, by the processor, a cross-correlation object between the target signal and the reference signals based on a waveform of the target signal and corresponding waveforms of the reference signals;
    generate, by the processor, a metric corresponding to a cross-correlation between at least a portion of the target signal and at least a portion of the cross-correlation object;
    modify, by the processor and based on the metric, a control object, the control object being of the circuit associated with the target signal; and
    modify, by the processor, a presentation of the control object at a graphical user interface.

20. The computer readable medium of claim 19, wherein the computer readable medium further includes one or more instructions executable by the processor to:
    generate the cross-correlation object by combining the waveform of the target signal and the corresponding waveforms of the reference signals.

* * * * *